(12) United States Patent
Soda et al.

(10) Patent No.: US 9,391,086 B1
(45) Date of Patent: Jul. 12, 2016

(54) NONVOLATILE SEMICONDUCTOR MEMORY DEVICE AND METHOD OF MANUFACTURING NONVOLATILE SEMICONDUCTOR MEMORY DEVICE

(71) Applicant: Kabushiki Kaisha Toshiba, Minato-ku (JP)

(72) Inventors: Eiichi Soda, Miegunkomono (JP); Kazunori Horiguchi, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/823,143

(22) Filed: Aug. 11, 2015

Related U.S. Application Data

(60) Provisional application No. 62/119,624, filed on Feb. 23, 2015.

(51) Int. Cl.
*H01L 21/00* (2006.01)
*H01L 27/115* (2006.01)
*H01L 21/28* (2006.01)

(52) U.S. Cl.
CPC .......... *H01L 27/11568* (2013.01); *H01L 21/28* (2013.01); *H01L 27/11582* (2013.01)

(58) Field of Classification Search
CPC ................... H01L 27/11568; H01L 27/11582; H01L 21/28
See application file for complete search history.

(56) References Cited

U.S. PATENT DOCUMENTS

| | | | |
|---|---|---|---|
| 8,441,061 B2 | 5/2013 | Nakao et al. | |
| 8,900,984 B2 | 12/2014 | Nakao et al. | |
| 2003/0052409 A1* | 3/2003 | Matsuo | H01L 21/486 257/737 |
| 2006/0192266 A1* | 8/2006 | Willer | H01L 27/115 257/510 |
| 2009/0242966 A1* | 10/2009 | Son | H01L 27/11578 257/324 |
| 2011/0156132 A1* | 6/2011 | Kiyotoshi | H01L 27/11575 257/326 |
| 2011/0233646 A1* | 9/2011 | Mizushima | H01L 27/11578 257/324 |
| 2011/0287612 A1* | 11/2011 | Lee | H01L 27/11578 438/478 |
| 2012/0083077 A1* | 4/2012 | Yang | H01L 27/11582 438/156 |
| 2012/0119287 A1* | 5/2012 | Park | H01L 27/11519 257/329 |

FOREIGN PATENT DOCUMENTS

| | | |
|---|---|---|
| JP | 2002-319619 | 10/2002 |
| JP | 2011-060991 | 3/2011 |

* cited by examiner

*Primary Examiner* — Nicholas Tobergte

(74) *Attorney, Agent, or Firm* — Oblon, McClelland, Maier & Neustadt, L.L.P.

(57) ABSTRACT

According to one embodiment, a nonvolatile semiconductor memory device includes a stacked body in which a spacer film and an electrode film are alternately stacked each in a plurality of layers, and a pillar member disposed in the stacked body and penetrating the stacked body in a thickness direction. The pillar member includes an inter-electrode insulating film, a charge accumulation film, a tunnel insulating film, and a channel semiconductor film in this order from a side in contact with the stacked body. The stacked body has a taper angle of 90° in a vertical cross section of the stacked body including the pillar member.

8 Claims, 18 Drawing Sheets

NONVOLATILE SEMICONDUCTOR MEMORY DEVICE AND METHOD OF MANUFACTURING NONVOLATILE SEMICONDUCTOR MEMORY DEVICE

CROSS-REFERENCE TO RELATED APPLICATIONS

This application is based upon and claims the benefit of priority from U.S. Provisional Application No. 62/119,624, filed on Feb. 23, 2015; the entire contents of which are incorporated herein by reference.

FIELD

Embodiments described herein relate generally to a nonvolatile semiconductor memory device and a method of manufacturing a nonvolatile semiconductor memory device.

BACKGROUND

In recent years, since scaling of semiconductor devices has been advanced, there has been proposed a nonvolatile semiconductor memory device of a three-dimensional structure type that includes memory cells forming a multilayer structure. According to the nonvolatile semiconductor memory device of the three-dimensional structure type, films to serve as memory elements are stacked in the vertical direction and are processed together, so that a number of memory cells are formed within a unit plane. In this case, the cost per one bit can be reduced.

When the nonvolatile semiconductor memory device of the three-dimensional structure type is manufactured, a stacked body is formed such that a sacrificial film and a spacer film, each of which is made of an insulating material, are alternately stacked each in a plurality of layers, then memory holes are formed through the stacked body by etching, then a channel and so forth are formed in each memory hole, and then each sacrificial film is replaced with a conductive material for forming a gate structure in the nonvolatile semiconductor memory device.

As the number of stacked layers in the stacked body is increased and the thickness of the layers is increased, it comes to take a longer time to form the memory holes. Particularly, as a position in the stacked body is closer to the lower side, the amount of etchant to be supplied thereto is reduced due to the presence of reaction products, and the etching rate is thereby lowered. Further, along with an increase in the etching time, bowing ends up being caused.

DETAILED DESCRIPTION

In general, according to one embodiment, a nonvolatile semiconductor memory device includes a stacked body in which a spacer film and an electrode film are alternately stacked each in a plurality of layers, and a pillar member disposed in the stacked body and penetrating the stacked body in a thickness direction. The pillar member includes an inter-electrode insulating film, a charge accumulation film, a tunnel insulating film, and a channel semiconductor film in this order from a side in contact with the stacked body. The stacked body has a taper angle of 90° in a vertical cross section of the stacked body including the pillar member.

An exemplary embodiment of a nonvolatile semiconductor memory device and a method of manufacturing a nonvolatile semiconductor memory device will be explained below in detail with reference to the accompanying drawings. The present invention is not limited to the following embodiment. The sectional views, the top view, and the perspective view of a nonvolatile semiconductor memory device used in the following embodiment are schematic, and so the relationship between the thickness and width of each layer and/or the thickness ratios between respective layers may be different from actual states.

The embodiment described hereinafter is applied to a nonvolatile semiconductor memory device having a structure that memory cells (transistors) of the SGT (Surrounding Gate Transistor) type are provided in a height direction. Each of the memory cells includes a semiconductor film serving as a channel and formed as a vertical column above a substrate, and a gate electrode film formed on the side surface of the semiconductor film, through a tunnel insulating film, a charge accumulation film, and an inter-electrode insulating film. Thus, at first, an example of the entire structure of such a nonvolatile semiconductor memory device will be explained, and then the embodiment will be explained.

Figure 1:
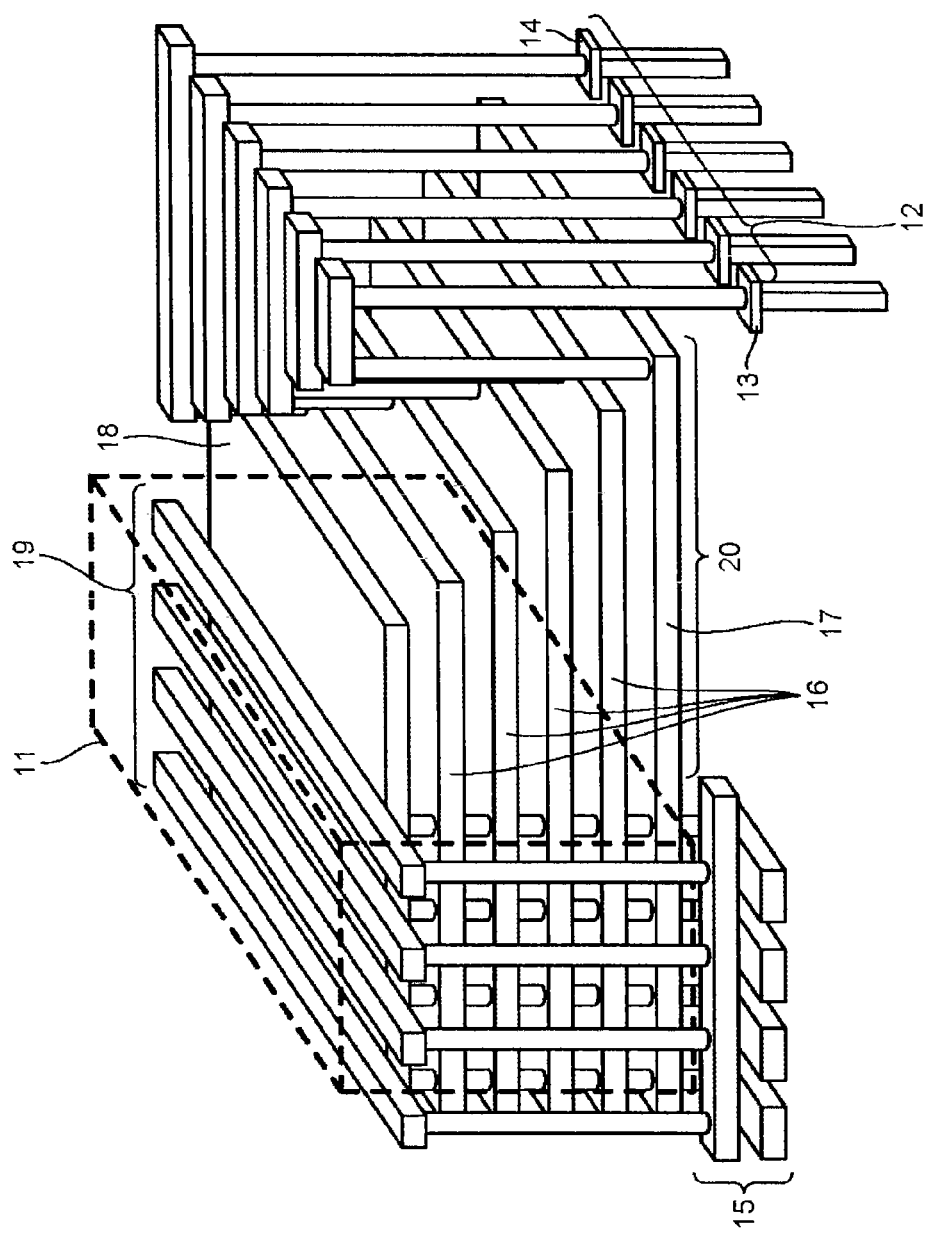
FIG. 1 is a perspective view schematically showing an example of a structure of a nonvolatile semiconductor memory device.

FIG. 1 is a perspective view schematically showing an example of a structure of a nonvolatile semiconductor memory device. The nonvolatile semiconductor memory device includes a memory cell part 11, a word line drive circuit 12, a source-side selection gate line drive circuit 13, a drain-side selection gate line drive circuit 14, a sense amplifier 15, word lines 16, a source-side selection gate line 17, a drain-side selection gate line 18, and bit lines 19.

The memory cell part 11 is configured such that a plurality of memory strings are arranged above a substrate, wherein each memory string includes memory cell transistors (each of which will also be simply referred to as a memory cell, hereinafter), a drain-side selection transistor and a source-side selection transistor respectively provided at the upper and lower ends of the memory cell column. As described later, each of the memory cell transistors, the drain-side selection transistor, and the source-side selection transistor is structured such that a gate electrode is formed on the side surface of a hollow columnar structure body including a semiconductor film, a tunnel insulating film, a charge accumulation film, and an inter-electrode insulating film stacked in this order. In each memory cell transistor, the gate electrode serves as a control gate electrode, and, in each of the drain-side selection transistor and the source-side selection transistor, the gate electrode serves as a selection gate electrode. The structure shown here is exemplified by a case where one memory string is provided with memory cells in four layers.

Each word line 16 connects the control gate electrodes of memory cells at the same height to each other among memory strings present within a predetermined range. The direction in which the word lines 16 extend will be referred to as a word line direction, hereinafter. Further, the source-side selection gate line 17 connects the selection gate electrodes of source-side selection transistors to each other among the memory strings present within the predetermined range, and the drain-side selection gate line 18 connects the selection gate electrodes of drain-side selection transistors to each other among the memory strings present within the predetermined range. Further, the bit lines 19 are arranged such that they are respectively connected to the upper sides of the memory strings in a direction intersecting with the word line direction (in this example, in a direction perpendicular thereto). The direction in which the bit lines 19 extend will be referred to as a bit line direction, hereinafter.

The word line drive circuit 12 is a circuit for controlling voltage to be applied to the word lines 16, the source-side selection gate line drive circuit 13 is a circuit for controlling voltage to be applied to the source-side selection gate line 17, and the drain-side selection gate line drive circuit 14 is a circuit for controlling voltage to be applied to the drain-side selection gate line 18. Further, the sense amplifier 15 is a circuit for amplifying an electric potential read from a selected memory cell. Here, in the following explanation, when there is no need to distinguish the source-side selection gate line 17 and the drain-side selection gate line 18 from each other, they will be simply referred to as selection gate lines. Further, when there is no need to distinguish the source-side selection transistor and the drain-side selection transistor from each other, they will be simply referred to as selection transistors.

The word lines 16, the source-side selection gate line 17, and the drain-side selection gate line 18 provided in the memory cell part 11 are connected to the word line drive circuit 12, the source-side selection gate line drive circuit 13, and the drain-side selection gate line drive circuit 14 respectively through contacts in a word line contact part 20 (electrode line contact part) provided for the memory cell part 11. The word line contact part 20 is arranged on a side of the memory cell part 11 facing the word line drive circuit 12, and has a structure formed such that the word lines 16 and the selection gate lines 17 and 18, which are connected to the memory cells at respective heights and the selection transistors, have been processed in a stepwise state.

Figure 2:
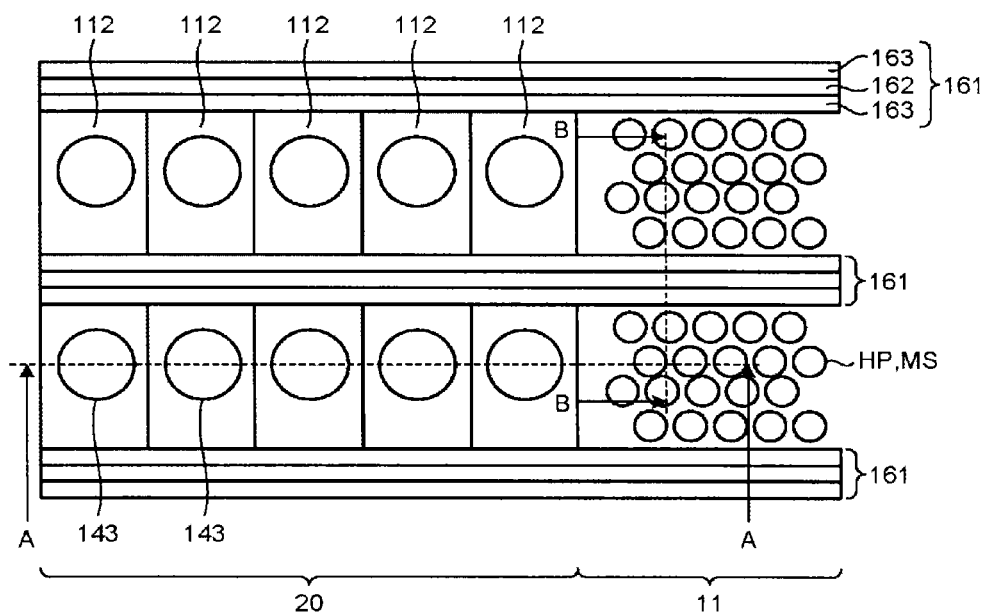
FIG. 2 is a top view schematically showing an example of an arrangement state in association with memory strings of a memory cell part and contacts of a word line contact part in a nonvolatile semiconductor memory device according to an embodiment.
Figure 3:
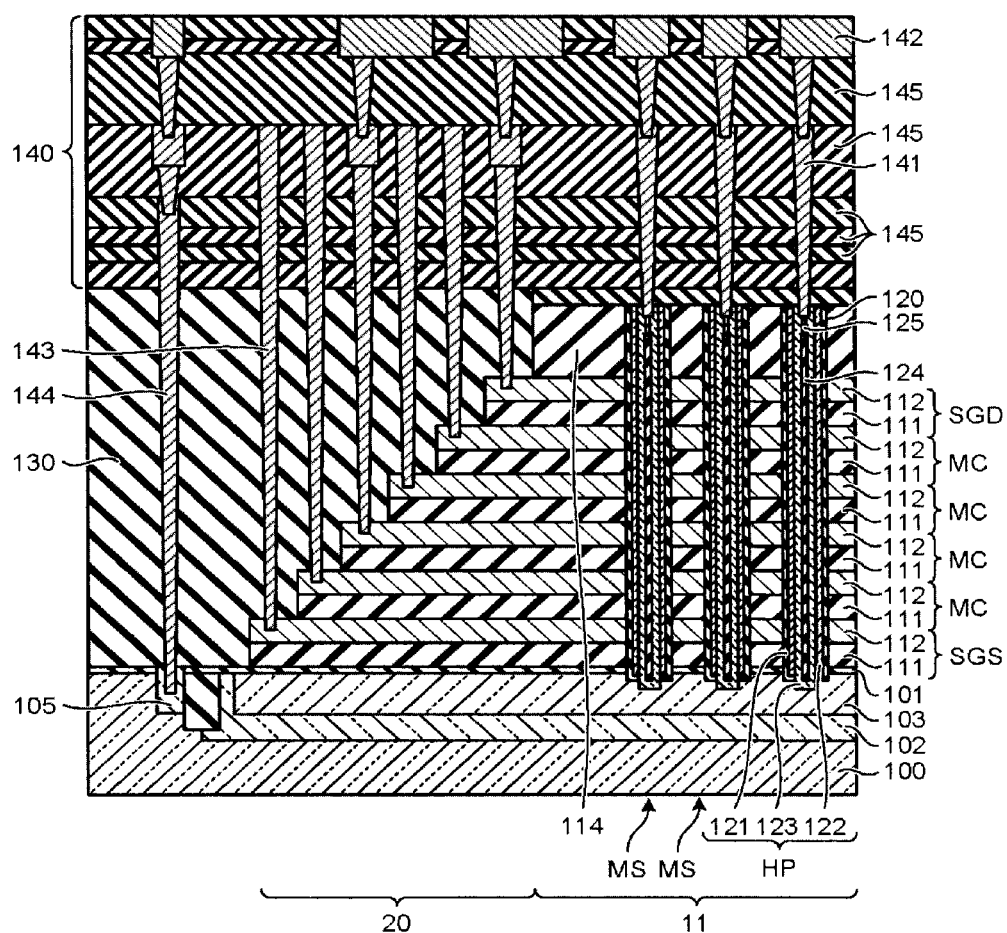
FIG. 3 is a sectional view schematically showing an example of a configuration, which is taken in a direction perpendicular to the bit line direction, of the memory cell part and the word line contact part in the nonvolatile semiconductor memory device according to the embodiment.
Figure 4:
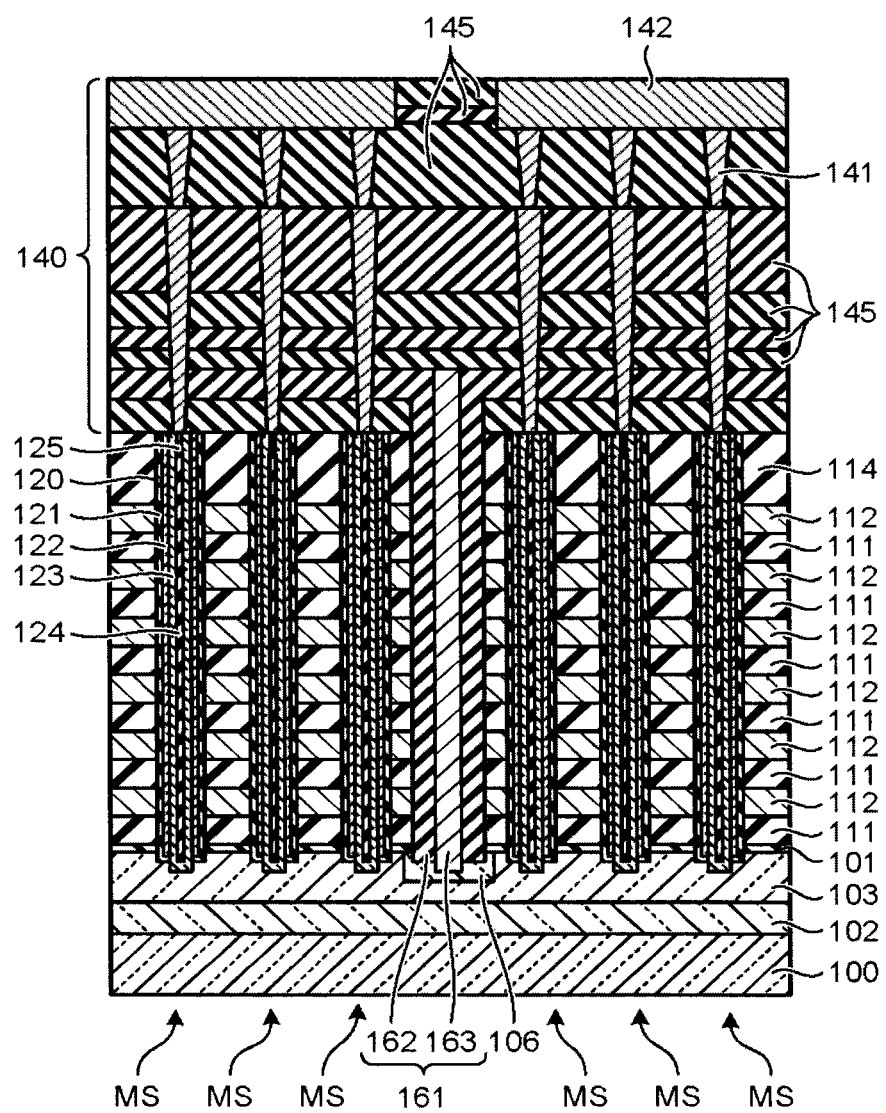
FIG. 4 is a sectional view schematically showing an example of a configuration, which is taken in a direction perpendicular to the word line direction, of the memory cell part and the word line contact part in the nonvolatile semiconductor memory device according to the embodiment.

FIG. 2 is a top view schematically showing an example of an arrangement state in association with memory strings of a memory cell part and contacts of a word line contact part in a nonvolatile semiconductor memory device according to an embodiment. FIG. 3 is a sectional view schematically showing an example of a configuration, which is taken in a direction perpendicular to the bit line direction, of the memory cell part and the word line contact part in the nonvolatile semiconductor memory device according to the embodiment. FIG. 4 is a sectional view schematically showing an example of a configuration, which is taken in a direction perpendicular to the word line direction, of the memory cell part and the word line contact part in the nonvolatile semiconductor memory device according to the embodiment. Here, FIG. 2 is a view, seen from the top, of a portion cut by a plane parallel with the substrate surface at a position between the drain-side selection transistor and the bit lines. Further, FIG. 3 corresponds to a sectional view taken along a line A-A in FIG. 2, and FIG. 4 corresponds to a sectional view taken along a line B-B in FIG. 2.

As shown in FIGS. 2 to 4, the memory cell part 11 includes memory strings MS formed almost vertically and arranged in a two-dimensional state on a semiconductor substrate 100. Each memory string MS has a configuration in which a plurality of transistors are connected in series. Each memory string MS includes a pillar member HP and electrode films 112. The pillar member HP has a structure in which an ONO film 121 having a hollow columnar shape is stacked on the outer peripheral surface of semiconductor films 123 and 122 having a hollow columnar shape, wherein the ONO film 121 is composed of a tunnel insulating film, a charge accumulation film, and an inter-electrode insulating film. The hollow columnar semiconductor films 123 and 122 serve as the channels of the transistors constituting the memory string MS. Each of the semiconductor films 123 and 122 may be formed of a poly-silicon film prepared by, e.g., annealing amorphous silicon. A plurality of electrode films 112 are arranged with spacer films 111 respectively interposed therebetween in the height direction of the pillar member HP.

Here, a filler insulating film 124, such as a silicon oxide film, is embedded in the hollow columnar semiconductor film 123 up to a predetermined height, and a cap film 125, such as a P-type amorphous silicon film, is further embedded thereon from the predetermined height.

In the column of the transistors connected in series in the height direction, the transistors at the upper and lower ends serve as selection transistors SGS and SGD. In the example shown in FIGS. 3 and 4, the source-side selection transistor SGS is arranged on the lower side, and the drain-side selection transistor SGD is arranged on the upper side. Between these two selection transistors SGS and SGD, one or more memory cell transistors MC are arranged at predetermined intervals. In this example, each of the selection transistors SGS and SOD has the same structure as the structure of each memory cell transistor MC.

As shown in FIG. 2, the memory cell part 11 and the word line contact part 20 are partitioned by dividing parts 161 that extend in the word line direction. Each dividing part 161 has a configuration in which an insulating film 162, such as a silicon oxide film, and a conductive film 163 are embedded in a slit that penetrates, in the thickness direction, the stacked body formed by stacking the spacer film 111 and the electrode film 112 each in a plurality of layers.

The lower end of the conductive film 163 reaches the semiconductor substrate 100. However, a non-conductive portion 106 is disposed at a region around the connecting portion between the conductive film 163 and the semiconductor substrate 100. With this arrangement, an electric current is prevented from flowing through the conductive film 163 in the nonvolatile semiconductor memory device. The non-conductive portion is formed of an N-type diffusion layer, for example.

The transistors at the same height in each region existing between dividing parts 161 are connected to each other by the same electrode film 112. For example, the source-side selection transistors SGS in each region existing between dividing parts 161 are connected to each other by the lowermost layer electrode film 112. The drain-side selection transistors SOD in each region existing between dividing parts 161 are connected to each other by the uppermost layer electrode film 112. These electrode films 112 serve as selection gate lines.

Further, the memory cells MC at the same height in each region existing between dividing parts 161 are connected to each other by the corresponding one of the electrode films 112. Each electrode film 112 connecting the memory cells MC serves as a word line.

As shown in FIG. 3, in the word line contact part 20, the electrode films 112 extending from the memory cell part 11 are arranged in a stacked state. The electrode films 112 form a stepwise configuration, so that the electrode films 112 on their lower sides are respectively exposed. The word line contact part 20 also has a structure in which a spacer film 111 is interposed between electrode films 112 vertically adjacent to each other.

In the word line contact part 20, a planarization film 130 is provided on the electrode films 112 set in a stepwise state. The planarization film 130 may be formed of a silicon oxide film, for example.

A wiring formation layer 140 is arranged on the memory strings MS of the memory cell part 11 and the planarization film 130 of the word line contact part 20. The wiring formation layer 140 has a structure in which a wiring layer 142 formed by patterning is arranged between interlayer insulating films 145 stacked in the height direction. Each interlayer insulating film 145 may be formed of a TEOS (Tetraethyl orthosilicate)/O$_3$ film or silicon nitride film, for example. Further, the wiring layer 142 may be made of tungsten (W), aluminum (Al), or copper (Cu).

Contacts 141 are formed in the interlayer insulating films 145, so that they connect the upper ends of the memory strings MS to the wiring layer 142. Further, contacts 143 are formed in the interlayer insulating films 145 and the planarization film 130, so that they connect the electrode films 112 at respective levels of the word line contact part 20 to the wiring layer 142.

In the region for forming the memory cell part 11 and the word line contact part 20, an N-type well 102 is formed in the upper surface of the semiconductor substrate 100, and a P-type well 103 is further formed in the N-type well 102.

Other than the parts described above, the semiconductor substrate 100 is provided with a peripheral circuit and so forth. The peripheral circuit includes elements, such as transistors, (not shown). FIG. 3 shows a state where a contact 144 is connected to the source region 105 of a peripheral circuit transistor.

Figure 5:
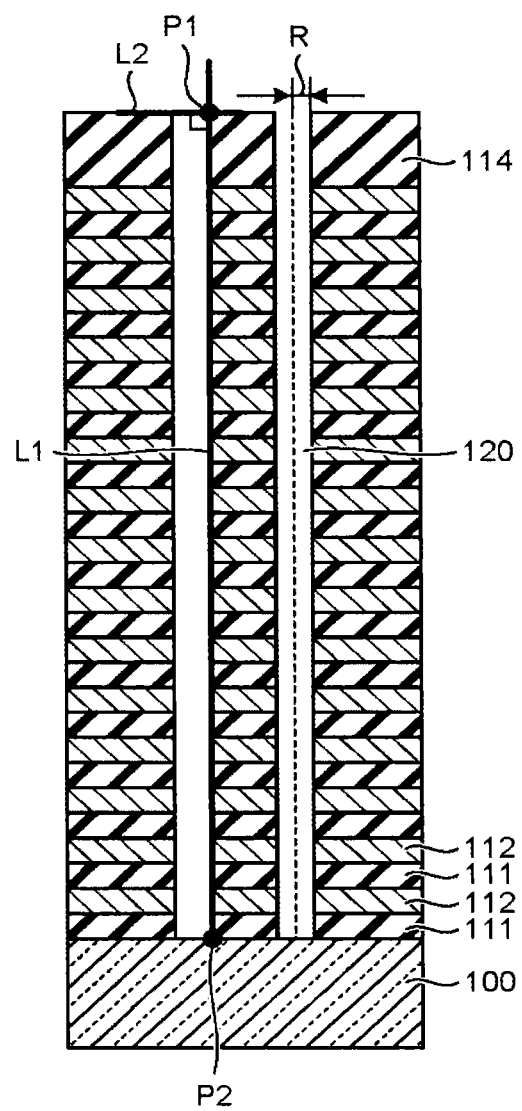
FIG. 5 is a sectional view schematically showing an example of a configuration of a memory hole by which a memory string is formed in the nonvolatile semiconductor memory device according to the embodiment.
Figure 6:
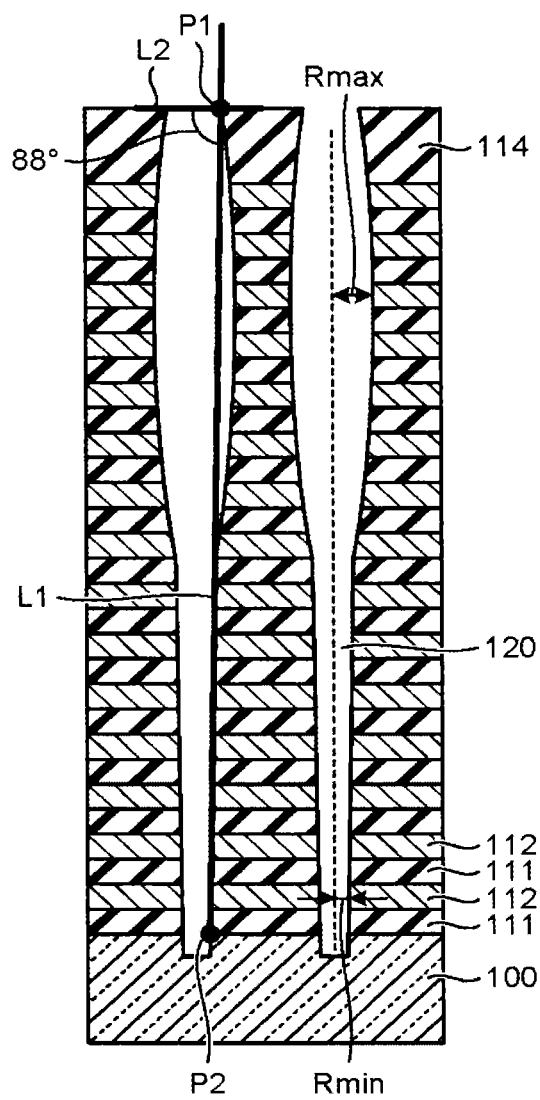
FIG. 6 is a sectional view showing a configuration of a memory hole in a nonvolatile semiconductor memory device according to a comparative example.

FIG. 5 is a sectional view schematically showing an example of a configuration of a memory hole by which a memory string is formed in the nonvolatile semiconductor memory device according to the embodiment. FIG. 6 is a sectional view showing a configuration of a memory hole in a nonvolatile semiconductor memory device according to a comparative example. Here, it is assumed that the height of the stacked films is about 4 μm.

As shown in FIG. 6, in the nonvolatile semiconductor memory device according to the comparative example, since bowing is caused during etching, the memory hole 120 for embedding the pillar member HP therein includes a portion where the radius of the memory hole 120 (which will be referred to as a hole radius, hereinafter) is larger than the ideal hole radius. As a result, the taper angle of the memory hole 120 in the vertical cross section becomes about 88°. Here, the taper angle is defined by an angle formed by a straight line L1 and a straight line L2, wherein the straight line L1 connects an upper corner P1 of the memory hole 120 to a bottom corner P2 at a position corresponding to this upper corner P1, and the straight line L2 extends through the upper corner P1 in parallel with the substrate surface. Further, where ΔCD denotes the difference between the maximum value Rmax and the minimum value Rmin of the hole radius, the ΔCD falls within a range of 1 nm to 50 nm.

On the other hand, in the nonvolatile semiconductor memory device according to the embodiment shown in FIG. 5, since bowing is hardly caused in the memory hole 120 during etching as described later, the hole radius R becomes almost the same in the depth direction. As a result, the taper angle of the memory hole 120 in the vertical cross section becomes almost a right angle. Further, the ΔCD of the hole radius becomes 0 nm.

This is also true for the dividing part 161, in addition to the memory hole 120 (hollow columnar pillar member HP). Further, as shown in FIG. 4, in the nonvolatile semiconductor memory device according to the embodiment, each spacer film 111 at a position in contact with the corresponding one of the dividing parts 161 has a rectangular shape in the cross section perpendicular to the extending direction of the dividing parts 161. In other words, the corners of this spacer film 111 on the side in contact with the dividing part 161 are almost not rounded but angular.

Next, an explanation will be given of a method of manufacturing the nonvolatile semiconductor memory device having this configuration. FIGS. 7A to 7L are sectional views schematically showing an example of a process sequence of a method of manufacturing the nonvolatile semiconductor memory device according to the embodiment. Here, FIGS. 7A to 7L correspond to part of the sectional view taken along the line B-B in FIG. 2.

Figure 7A:
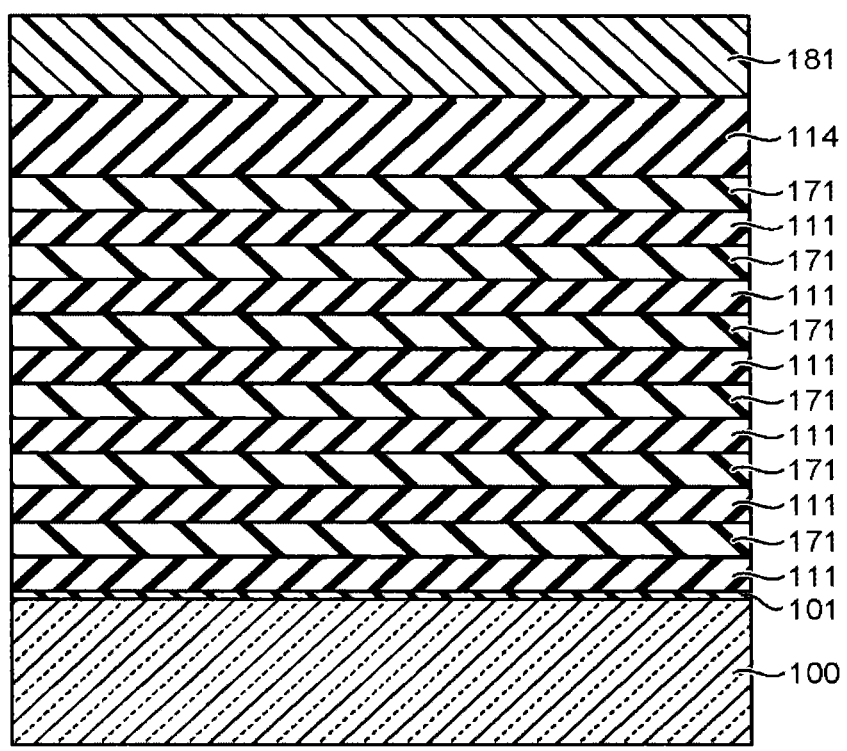
FIGS. 7A to 7L are sectional views schematically showing an example of a process sequence of a method of manufacturing the nonvolatile semiconductor memory device according to the embodiment.

At first, as shown in FIG. 7A, an insulating film 101 is formed to be used as a gate insulating film of peripheral circuit transistors (not shown) on a semiconductor substrate 100, such as a silicon substrate. The insulating film 101 may be formed by a thermal oxidation method or the like. The insulating film 101 may be formed of a silicon oxide film, for example. Then, a spacer film 111 and a sacrificial film 171 are alternately stacked each in a predetermined number of layers on the insulating film 101, and an insulating film 114 is further stacked as the uppermost portion, so that a stacked body is formed. Further, a resist 181 is applied to the entire surface of the stacked body. Between the resist 181 and the insulating film 114 at the uppermost side, a structure including an Si-containing film and a carbon layer may be interposed.

The spacer film 111 may be formed of a silicon oxide film, for example. The insulating film 114 may be made of the same material as that of the spacer film 111. The insulating film 114 may be formed of a silicon oxide film, for example.

The sacrificial film 171 may be made of a material that has a selective ratio relative to the spacer film 111 and has high reactivity to the etchant, in etching the stacked body. The sacrificial film 171 having such properties is exemplified by a porous film. The thickness of each of the spacer film 111 and the sacrificial film 171 may be set to several ten nm.

The porosity of the porous film may be set to 0.1 to 95 vol %, although it is preferably set higher to increase the etching rate. When the spacer film 111 is formed of a silicon oxide film, a fluorocarbon based gas is used for etching. In this case, the porous film is preferably formed of a porous nitride film containing nitrogen (N). The porous nitride film may be exemplified by SiN, SiNH, SiON, SiCN, SiBN, BCN, or BN.

Further, the porous film may be formed of a porous film containing hydrogen (H) or carbon (C), which is exemplified by SiOH, SiOCH, Hydrogen silsesquioxane (HSQ), methyl silsesquioxane (MSQ), or polyimide.

The porous film of this kind may be formed by a CVD (Chemical Vapor Deposition) method or coating method. For example, in the case of a carbon based CVD film, the film is formed by a CVD method and is then heat-processed at 550 to 650° C. to make the film denser, in general. If a film is made denser, its etching resistance is improved, and its etching rate is thereby lowered. On the other hand, according to this embodiment, the sacrificial film 171 is formed by a CVD method and is then heat-processed at a temperature lower than 550 to 650° C. Consequently, the carbon based CVD film is suppressed from being made denser, so that a porous film is obtained.

Further, when the sacrificial film 171 is formed, a carbon based gas is added to the raw material gas of the sacrificial film 171. Consequently, the functional group of the carbon based gas is taken into the sacrificial film 171. Thereafter, the functional group taken in the film is removed, so that a porous film is formed.

Besides, an SiNH film is known to become a fragile film by increasing the content of hydrogen (H). Accordingly, if the H ratio is increased relative to N, the sacrificial film 171 can be obtained to have high reactivity to the etchant.

A film produced by a coating method tends to become a fragile and porous film, in general. Accordingly, if the sacrificial film 171 is produced by a coating method, a porous film can be easily obtained. Here, this embodiment is exemplified by a case where the sacrificial film 171 is formed of a porous silicon nitride film (SiN film).

Further, although not shown here, in the word line contact part 20, etching is performed to each set of a sacrificial film 171 and a spacer film 111 from the top, so that the stepwise structure is formed. Formation of this stepwise structure can be performed by use of known techniques. Thereafter, a planarization film 130 is formed on the word line contact part 20 including the stepwise structure thus formed. The planarization film 130 may be formed of a silicon oxide film, for example.

Figure 7B:
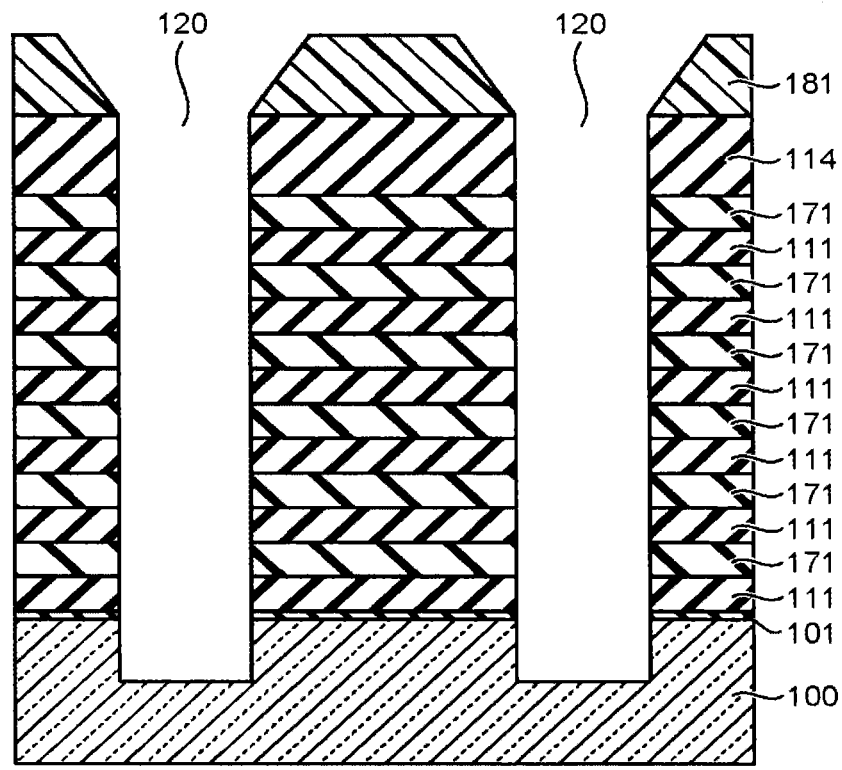

Then, as shown in FIG. 7B, patterning is performed to the resist 181 by use of a lithography technique and a development technique. Here, the pattern is formed to include openings at positions for forming memory strings MS. Then, anisotropic etching is performed by use of an RIE method or the like, through the resist 181 serving as a mask, so that memory holes 120 are formed. The memory holes 120 are formed to penetrate the stacked body in the thickness direction. Further, the bottom of each memory hole 120 reaches the semiconductor substrate 100.

When the memory holes 120 are formed, etching is alternately performed to the spacer film 111 and the sacrificial film 171. Since the sacrificial film 171 is formed of a porous film, the etching rate of the sacrificial film 171 becomes higher, as compared with the conventional case. Further, when the bottom of each memory hole 120 is processed, reaction products are diffused into the porous film, and thus the amount of etchant to be supplied to the bottom of each memory hole 120 is not reduced. Consequently, the etching rate at the bottom of each memory hole 120 is increased. Further, as compared with a case where the sacrificial film 171 is not formed of a porous film, this embodiment can shorten the etching time and can prevent bowing from being caused. As a result, the variation in hole radius in the depth direction of the memory holes 120 is reduced, so that the taper angle of each memory hole 120 becomes almost a right angle, as shown in FIG. 5.

Figure 7C:
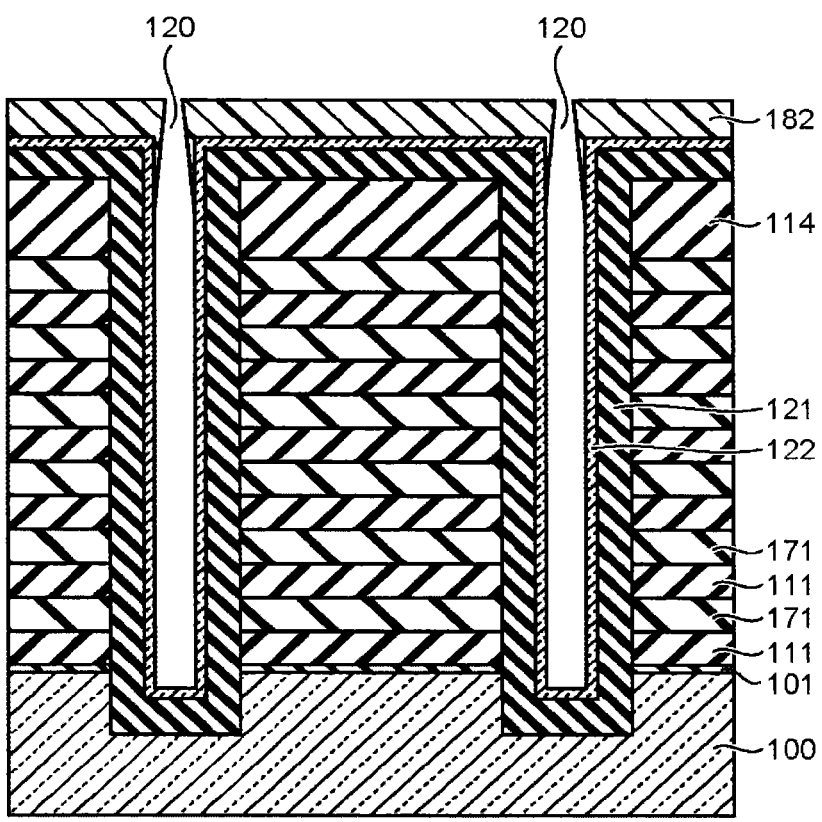

Thereafter, as shown in FIG. 7C, an ONO film 121, which is formed of stacked films of a silicon oxide film/a silicon nitride film/a silicon oxide film, is formed to cover the upper surface of the insulating film 114 and the inner surfaces of the memory holes 120. The ONO film 121 provides the functions of an inter-electrode insulating film, a charge accumulation film, and a tunnel insulating film, from the side adjacent to the inner surface of each memory hole 120. The thickness of the ONO film 121 may be set to 15 nm, for example.

Then, a semiconductor film 122 is formed on the ONO film 121. The semiconductor film 122 is formed such that it covers, also in a conformal state, each memory hole 120 including the ONO film 121 formed thereon. This semiconductor film 122 serves to cover and prevent part of the ONO film 121 formed on the sidewall of each memory hole 120 from being removed, when part of the ONO film 121 formed at the bottom of each memory hole 120 is being removed by etching. The semiconductor film 122 may be made of amorphous silicon. Further, its thickness may be set to 7 nm. Further, a carbon film 182 is formed in a non-conformal state only on the entire surface of the semiconductor film 122, so that openings are formed at positions corresponding to the memory holes 120.

Figure 7D:
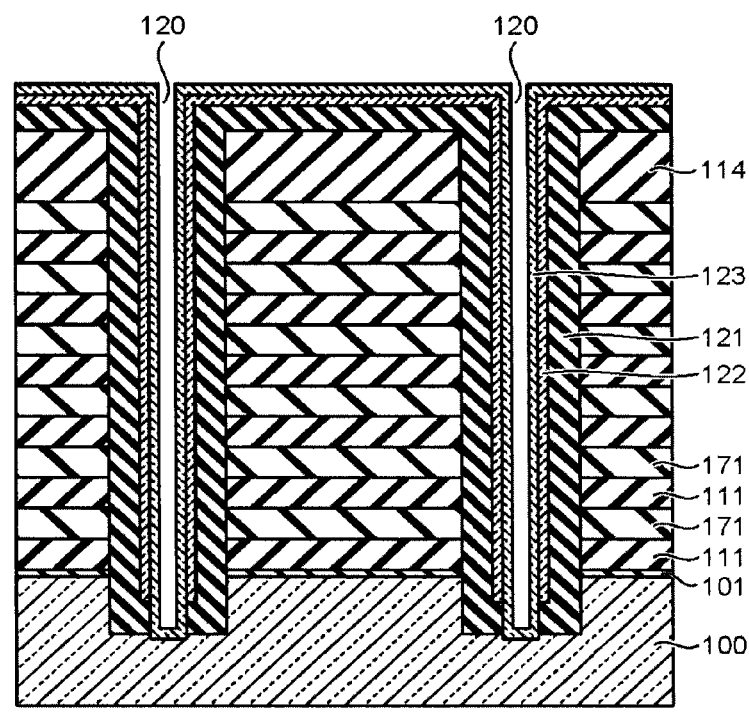

Thereafter, anisotropic etching is performed by use of an RIE method or the like, through the carbon film 182 serving as a mask, so that part of the semiconductor film 122 and part of the ONO film 121 at the bottom of each memory hole 120 are removed. Then, the carbon film 182 is removed, and, thereafter, as shown in FIG. 7D, a semiconductor film 123 is formed to cover the upper surface of the semiconductor film 122 and the inner surfaces of the memory holes 120. The semiconductor film 123 may be made of amorphous silicon. Further, its thickness may be set to 15 nm. The semiconductor films 122 and 123 are used to serve as the channels of the memory cells MC and the selection transistors SGS and SGD. Further, the semiconductor films 122 and 123 and the ONO film 121 respectively have hollow and circular columnar shapes and they form a stacked structure in the radial direction.

Figure 7E:
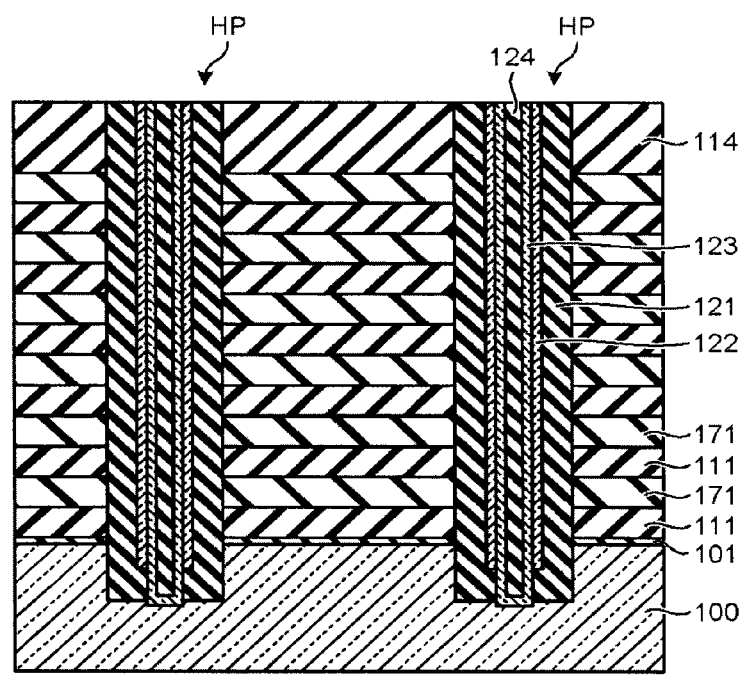

Then, as shown in FIG. 7E, a filler insulating film 124 is formed on the upper surface of the semiconductor film 123 and is embedded in each memory hole 120 covered with the ONO film 121 and the semiconductor films 122 and 123. Thereafter, the films existing above the insulating film 114 are removed by use of a CMP (Chemical Mechanical Polishing) method, so that the upper surface is planarized. Consequently, a hollow columnar pillar member HP including the ONO film 121 and the semiconductor films 122 and 123 is formed inside each memory hole 120.

Figure 7F:
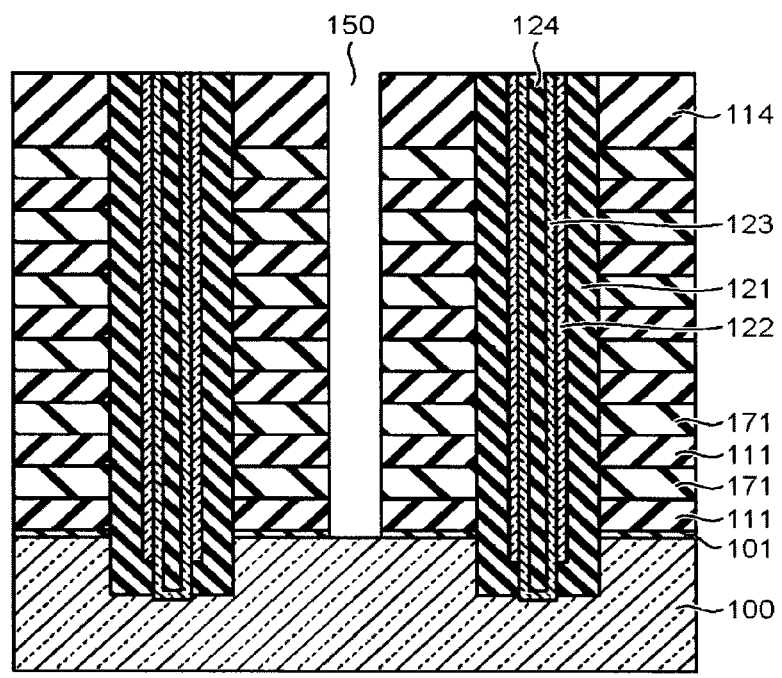

Thereafter, as shown in FIG. 7F, a resist (not shown) is applied onto the stacked body, and then a resist pattern including openings for forming slits is formed by use of a lithography technique and a development technique. The openings for forming slits have shapes extending in the word line direction, and they are formed at predetermined intervals in the bit line direction over an area including the memory cell part 11 and the word line contact part 20.

Then, etching is performed to the stacked body through the resist pattern (not shown) serving as a mask, so that slits 150 are formed. Each slit 150 reaches the upper side of the semiconductor substrate 100. When the slits 150 are formed, etching is performed to the sacrificial film 171 formed of a porous film, as in the formation of the memory holes 120, and thus the etching time is shortened, as compared with a case where the sacrificial film 171 is not formed of a porous film. As a result, this embodiment can prevent the etching rate from being higher at the bottom of each slit 150, and can prevent bowing from being caused in each slit 150.

Figure 7G:
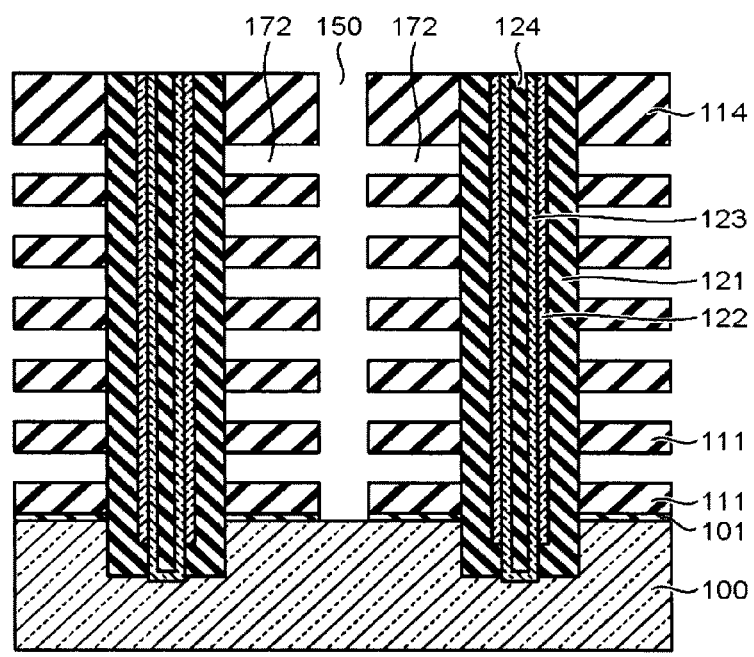

Then, as shown in FIG. 7G, the sacrificial films 171 are removed by etching. For example, wet etching using hot phosphoric acid, or dry etching, such as CDE (Chemical Dry Etching), is performed, so that each sacrificial film 171 made of an SiN film is removed. More specifically, the etchant penetrates through the slits 150 formed as described above, and etches each sacrificial film 171 above the semiconductor substrate 100. Thus, a gap space 172 is formed at the region where each sacrificial film 171 has been present. As a result, as shown in FIG. 7G, a structure is provided such that the spacer films 111 and the insulating film 114 are supported by the side surfaces of the hollow columns, each of which stands perpendicular to the semiconductor substrate 100 and is formed of stacked films of the semiconductor films 123 and 122 and the ONO film 121. At this time, the etching is performed under conditions by which the selective ratio of the sacrificial films 171 relative to the spacer films 111 and the insulating film 114 is set to be sufficiently large.

Here, since each sacrificial film 171 is formed of a porous SiN film, the time necessary for removing the sacrificial films 171 by this etching process is shortened, as compared with a case where the sacrificial film 171 is not formed of a porous SiN film. Consequently, the etched amount of each spacer film 111 made of a silicon oxide film becomes sufficiently smaller, as compared with a case where the sacrificial film 171 is not formed of a porous SiN film. As a result, the corners of each spacer film 111 are hardly etched and are kept in a rectangular shape in the cross section perpendicular to the extending direction of the slits 150.

Figure 7H:
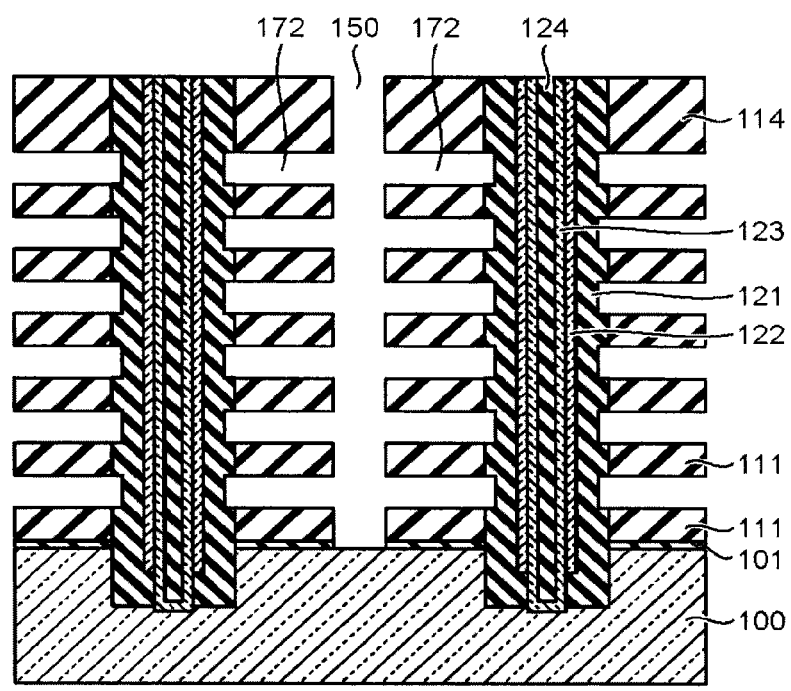

Then, as shown in FIG. 7H, the ONO film 121 is partly removed by etching. For example, wet etching using dilute hydrofluoric acid is performed, so that the silicon oxide film forming the inter-electrode insulating film of the ONO film 121 is partly removed. At this time, the etching time is controlled not to entirely remove the inter-electrode insulating film.

Figure 7I:
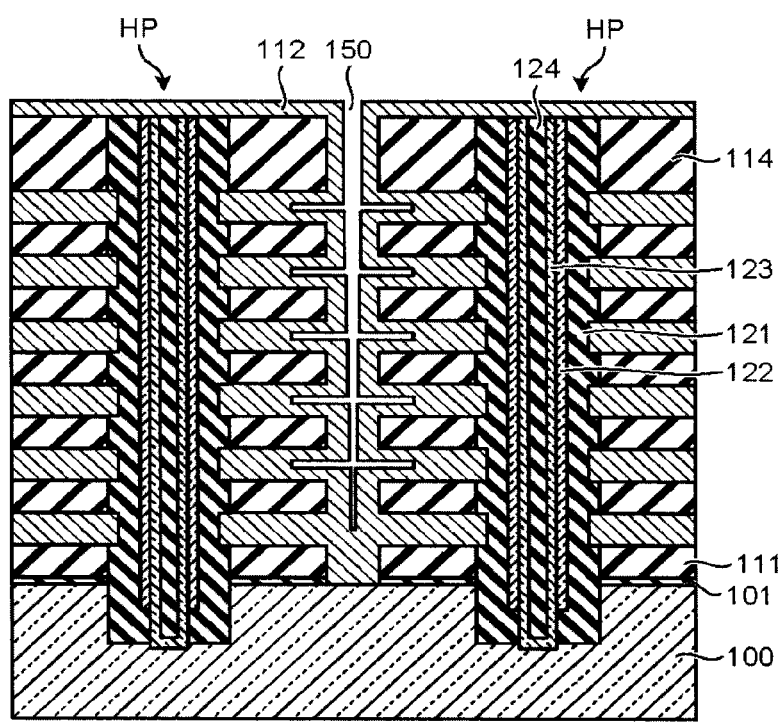

Thereafter, as shown in FIG. 7I, an electrode film 112 is formed in a conformal state by a film formation method, such as a CVD method, in the slits 150 and the gap spaces 172 between the spacer films 111 in the vertical direction. More specifically, the electrode film 112 is formed to cover the surfaces of the spacer films 111 and the insulating film 114 protruding in the direction parallel with the substrate surface, and to cover the side surfaces of the pillar members HP in contact with the gap spaces 172. The electrode film 112 may be made of W or the like.

Figure 7J:
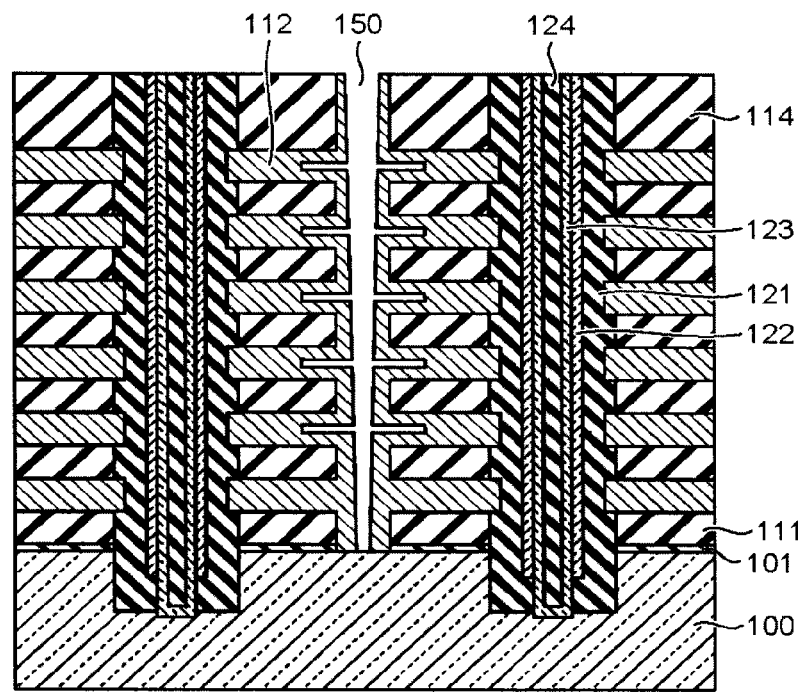
Figure 7K:
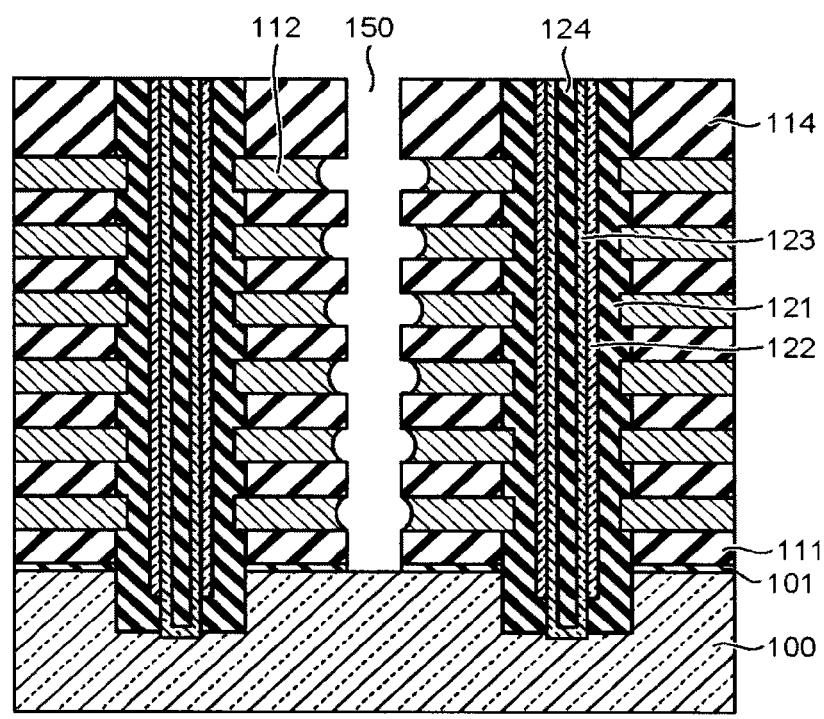
Figure 7L:
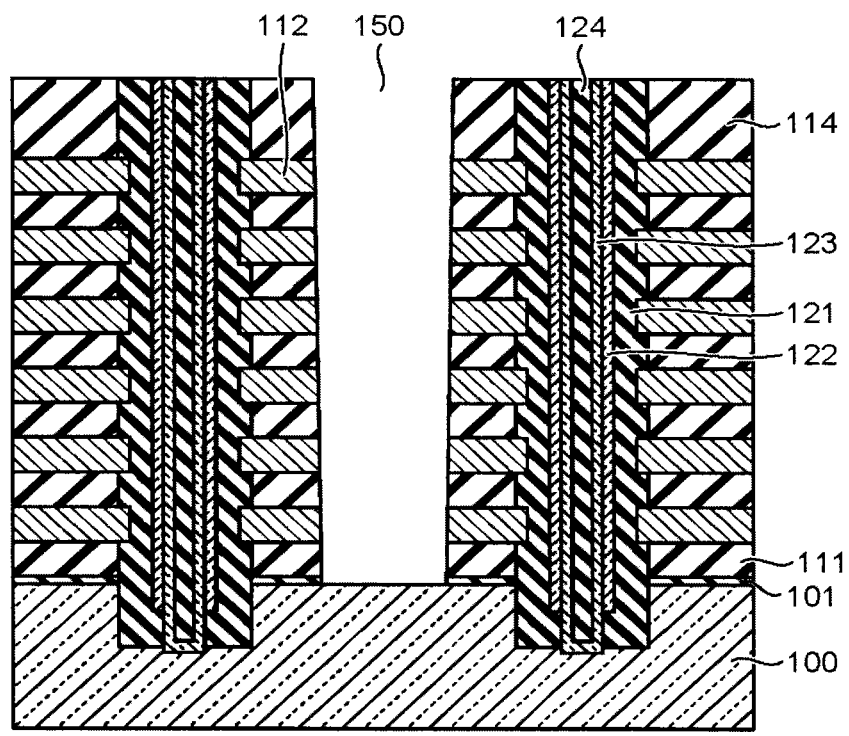

Thereafter, as shown in FIG. 7J, anisotropic etching is performed by use of an RIE method or the like, so that stepped portions of the electrode film 112 deposited on the side surfaces of the insulating film 114 and the spacer films 111 are removed. Then, as shown in FIG. 7K, isotropic etching is performed by use of a ODE method or wet etching, so that portions of electrode films 112, which protrude from the side surfaces of the spacer films 111, are removed. Further, as shown in FIG. 7L, anisotropic etching is performed by use of an RIE method or the like to the insulating film 114, the spacer films 111, and the electrode films 112, so that the side surface of each slit 150 becomes almost flat. Thereafter, a non-conductive portion (not shown) is formed in the region at the bottom of each slit 150 by use of an ion implantation method.

Then, an insulating film 162 is formed to cover the upper surface of the insulating film 114, the inner surface of each slit 150, and the upper surface of the planarization film 130. Thereafter, anisotropic etching is performed by use of an RIE method or the like, through a resist pattern including openings at the positions of the slits 150 and serving as a mask, so that part of the insulating film 162 at the bottom of each slit 150 is removed. Further, a conductive film 163 is embedded in each slit 150 including the insulating film 162 covering its side surface. Thereafter, part of the conductive film 163 above the insulating film 162 is removed by a CMP method or the like. Further, interlayer insulating films 145 are formed over the memory cell part 11 and the word line contact part 20, and then contact holes are formed therein at predetermined positions and are filled with contacts 141, 143, and 144 embedded therein. Further, a wiring layer 142 is formed to correspond to the positions of the contacts 141, 143, and 144. As a result, the nonvolatile semiconductor memory device shown in FIGS. 3 and 4 is obtained.

According to this embodiment, a stacked body is formed such that the electrode film 112 and the spacer film 111 are alternately stacked each in a plurality of layers, and the hollow columnar pillar members HP are formed to penetrate the stacked body in the thickness direction, wherein each pillar member HP includes stacked films composed of the semiconductor films 123 and 122 and the ONO film 121. At this time, the taper angle is set to 90° in the vertical cross section of each hollow columnar pillar member HP. Consequently, each memory hole provided with the pillar member HP has a hole radius in an almost uniform state entirely in the depth direction.

Further, according to this embodiment, a stacked body is formed such that the spacer film 111 and the porous sacrificial film 171, which has a selective ratio relative to the spacer film 111, are alternately stacked each in a plurality of layers, and the memory holes 120 are formed in the stacked body by anisotropic etching. At this time, since the sacrificial film 171 has high reactivity to the etchant, it is possible to increase the etching rate of the sacrificial film 171, and to shorten the etching time of the stacked body, as compared with a case where a sacrificial film 171 having low reactivity to the etchant is used. Further, since the etching time is shortened, it is also possible to prevent bowing of each memory hole 120, and to form the memory hole 120 with its side surface almost perpendicular to the substrate surface.

Further, when the bottom of each memory hole 120 is etched, reaction products are diffused into the porous sacrificial film 171. Accordingly, it is also possible to prevent a decrease in the amount of etchant to be supplied to the bottom of each memory hole 120, and to suppress a decrease in the etching rate.

Further, the same effects can be obtained for the slits 150 formed in the stacked body in the word line direction, as well as the memory holes 120.

Although the explanation described above is given of a case where the sacrificial film 171 is formed of a porous film, this is not limiting. As long as the sacrificial film 171 is made of a material that has a selective ratio relative to the spacer film 111 and has high reactivity to the etchant, the same effects as those described above can be obtained. Further, even if the material exemplified above is not porous, the reactivity of the sacrificial film 171 to the etchant can be set higher by using the same material as that described above and setting its density lower than the ordinary density which materials of this kind have.

In the explanation described above, the planarization film 130 is made of a silicon oxide film or the like. As shown in FIG. 3, the planarization film 130 is provided with the contacts 143 and 144. Accordingly, in place of the silicon oxide film, the planarization film 130 may be made of an insulating material that has high reactivity to the etchant, as in the sacrificial layer 171 described above. In this case, the etching rate of the planarization film 130 is preferably set to be higher than that of the silicon oxide film.

In the etching process for forming contact holes to the stepwise area of the word line contact part 20, as the position of a electrode film 112 is higher, a contact hole formed there reaches the electrode film 112 earlier. If the planarization film 130 is made of an insulating material that has high reactivity to the etchant, the time necessary for forming the contact holes can be shortened, as compared with a case where the planarization film 130 is formed of a silicon oxide film. Accordingly, in a period before a contact hole reaches the electrode film 112 at the deepest position, after the other contact holes reach the respective electrode films 112, the etched amount of the electrode films 112 at the bottoms of the contact holes can be reduced, as compared with the conventional case.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile semiconductor memory device, the method comprising:
   forming a stacked body by alternately stacking a spacer film and a sacrificial film each in a plurality of layers;
   forming a memory hole penetrating the stacked body in a stacked direction by etching;
   forming an inter-electrode insulating film, a charge accumulation film, a tunnel insulating film, and a channel semiconductor film in this order on a side surface of the memory hole;
   forming a slit extending in a first direction in the stacked body, the slit dividing the stacked body in a second direction intersecting with the first direction;
   supplying a first etchant through the slit to remove each sacrificial film; and
   embedding an electrode film into each gap space formed by removing each sacrificial film,
   wherein the sacrificial film is made of a material that has a selective ratio relative to the spacer film and has reactivity to a second etchant used etching the stacked body.

2. The method of manufacturing a nonvolatile semiconductor memory device according to claim 1, wherein the sacrificial film is formed of a porous film.

3. The method of manufacturing a nonvolatile semiconductor memory device according to claim 2, wherein the porous film contains nitrogen, hydrogen, or carbon.

4. The method of manufacturing a nonvolatile semiconductor memory device according to claim 3, wherein the insulating film is made of at least one material selected from the group consisting of SiN, SiNH, SiON, SiCN, SiBN, BCN, BN, SiOH, SiOCH, Hydrogen silsesquioxane, methyl silsesquioxane, and polyimide.

5. The method of manufacturing a nonvolatile semiconductor memory device according to claim 1, wherein the forming the stacked body includes
   adding a carbon based gas to a raw material gas forming the sacrificial film to form the sacrificial film that contains a functional group of the carbon based gas, and
   removing the functional group from the sacrificial film.

6. The method of manufacturing a nonvolatile semiconductor memory device according to claim 5, wherein the sacrificial film is formed by a CVD method.

7. The method of manufacturing a nonvolatile semiconductor memory device according to claim 1, wherein the sacrificial film is formed by a coating method.

8. The method of manufacturing a nonvolatile semiconductor memory device according to claim 1, wherein the sacrificial film is made of a material that contains nitrogen, hydrogen, or carbon at a density lower than an ordinary density of materials that contain nitrogen, hydrogen, or carbon.

* * * * *